(12) United States Patent
Yi et al.

(10) Patent No.: US 9,728,474 B1
(45) Date of Patent: Aug. 8, 2017

(54) SEMICONDUCTOR CHIPS WITH SEAL RINGS AND ELECTRONIC TEST STRUCTURES, SEMICONDUCTOR WAFERS INCLUDING THE SEMICONDUCTOR CHIPS, AND METHODS FOR FABRICATING THE SAME

(71) Applicant: Globalfoundries Singapore Pte. Ltd., Singapore (SG)

(72) Inventors: Wanbing Yi, Singapore (SG); Juan Boon Tan, Singapore (SG); Mahesh Bhatkar, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/278,257

(22) Filed: Sep. 28, 2016

(51) Int. Cl.
*H01L 23/10* (2006.01)
*H01L 21/66* (2006.01)
*H01L 23/31* (2006.01)
*H01L 23/485* (2006.01)
*H01L 43/08* (2006.01)

(52) U.S. Cl.
CPC .............. *H01L 22/32* (2013.01); *H01L 23/10* (2013.01); *H01L 23/3171* (2013.01); *H01L 23/485* (2013.01); *H01L 43/08* (2013.01)

(58) Field of Classification Search
CPC ......... H01L 43/08; H01L 23/10; H01L 23/31; H01L 23/317; H01L 23/3171; H01L 23/48; H01L 23/485; H01L 22/32
USPC ........................................................ 257/48
See application file for complete search history.

(56) References Cited

U.S. PATENT DOCUMENTS

| 6,876,062 | B2 | 4/2005 | Lee et al. |
| 7,202,550 | B2 | 4/2007 | Fu et al. |
| 7,256,475 | B2 | 8/2007 | Jao et al. |
| 8,217,394 | B2 | 7/2012 | Yang et al. |
| 8,237,160 | B2 | 8/2012 | Chen et al. |
| 8,334,582 | B2 | 12/2012 | Jeng et al. |
| 8,338,917 | B2 | 12/2012 | Yaung et al. |
| 8,436,472 | B2 | 5/2013 | Chen |
| 8,901,714 | B2 * | 12/2014 | Yen ........................ H01L 23/552 257/409 |
| 2007/0023915 | A1 * | 2/2007 | Jao ...................... G01R 31/2884 257/758 |
| 2007/0102791 | A1 | 5/2007 | Wu |
| 2008/0191205 | A1 | 8/2008 | Tsai et al. |
| 2008/0277659 | A1 * | 11/2008 | Hsu ......................... H01L 22/34 257/48 |
| 2009/0001522 | A1 | 1/2009 | Wu |

(Continued)

OTHER PUBLICATIONS

Chen et al., Investigation of seal-ring rules for IC product reliability in 0.25-um CMOS technology, Microelectronics Reliability, 2005, pp. 1311-1316, vol. 45.

*Primary Examiner* — Monica D Harrison
(74) *Attorney, Agent, or Firm* — Lorenz & Kopf, LLP

(57) ABSTRACT

A semiconductor chip includes an active area including a plurality of integrated circuit structures, a seal ring enclosing the active area, a corner area of the semiconductor chip that is outside of the seal ring, and an electronic test structure disposed within the corner area. Semiconductor wafers including the above-noted semiconductor chips, as well as methods for fabricating semiconductor wafers including the above-noted semiconductor chips, are also disclosed.

16 Claims, 5 Drawing Sheets

(56) References Cited

U.S. PATENT DOCUMENTS

2009/0008750 A1  1/2009  Tokitoh
2010/0078769 A1  4/2010  West et al.
2011/0115057 A1  5/2011  Harn et al.
2012/0175728 A1  7/2012  Yang et al.
2014/0035128 A1  2/2014  Chou et al.

* cited by examiner

SEMICONDUCTOR CHIPS WITH SEAL RINGS AND ELECTRONIC TEST STRUCTURES, SEMICONDUCTOR WAFERS INCLUDING THE SEMICONDUCTOR CHIPS, AND METHODS FOR FABRICATING THE SAME

TECHNICAL FIELD

The present disclosure generally relates to semiconductor chips, semiconductor wafers from which a plurality of semiconductor chips are formed, and the fabrication of semiconductor wafers and chips. More particularly, the present disclosure relates to seal rings for semiconductor chips and electronic test structures, such as readable/writable test structures, formed in the semiconductor chips.

BACKGROUND

Modern integrated circuits are made up of literally millions of active devices, such as transistors, capacitors, and the like. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective semiconductor "chip." Electrical connections are made through bond pads to connect the chip to a package substrate or another die.

These semiconductor chips may be used in a wide range of applications such as personal computers, cellular telephones, and gaming devices, among many others. Each chip is actually a small piece of semiconductor material onto and into which has been fabricated a large number of integrated circuits. A semiconductor material is a material that when properly prepared is capable of conducting electricity under certain controllable conditions, such as the application of a small electrical charge. Each of the small components in an integrated circuit is fabricated using successive layers of semiconductor, insulating, and conducting materials arranged in a certain fashion.

The fabrication process begins with providing a substrate of semiconductor material, typically formed in a flat, circular shape called a wafer. Each wafer is cut from an ingot of, for example, silicon, and will be used for the fabrication of a number of semiconductor chips. FIG. 1 is a plan (top) view of a wafer 10. As can be seen in FIG. 1, much of the surface 11 of wafer 10 is subdivided into a number of small square or rectangular areas that are at this stage referred to collectively as dice 12. These dice 12 are separated from each other by linear regions formed on surface 11 and sometimes referred to as scribe lines. For purposes of illustration, dice 16 through 19 are enumerated in FIG. 1 and shown as separated from each other by horizontal scribe line 14 and vertical scribe line 15. Note that the selection of these particular features for illustration is arbitrary, and in the example of FIG. 1 the dice and the scribe lines are substantially identical with respect to each other. Eventually, each good die will become a separate semiconductor chip when the fabrication process is complete.

A number of steps are involved in fabricating the individual structures used to create the electronic components that will form integrated circuits. These will not be described in detail here, although in general they involve the deposition of various layers of material that may selectively be removed, for example by chemical etching, to create the necessary structures. When fabrication is complete, or nearly so, the individual dice may be separated using one of several methods that are sometimes referred to as singulation, or dicing. Singulation is effected by cutting or breaking the wafer apart including, for example, at the pre-formed scribe lines 14 and 15 that are visible in FIG. 1.

It is well known to use a seal ring (which may also be referred to as a die seal, an edge seal, or a scribe seal) to protect a die against potential damage caused by stress induced defects such as crack formation and delamination formed during singulation processes such as sawing, wire-bonding or other assembly processes, soldering, or during rigorous environmental testing. The seal ring also provides a protection against moisture penetration. The scribe seal, which is typically formed around a perimeter of the die, is disposed between an active area of the die and a scribe line. It is also well known that stress induced defects such as cracks and delamination are likely to occur near die corners where susceptibility to die failure from such defects is highest. Conventional techniques to reduce damage caused by stress include providing a die layout having a sloped or chamfered corner area rather than a die layout having a sharp corner, e.g., a 90 degree corner, and providing redundant seal rings for added protection. The presence of chamfered corners results in triangular areas, at each corner, within the redundant seal rings. In advanced technology nodes, such as the 40 nm technology node and smaller, these triangular areas are typically left empty, i.e., with no circuitry or other structures disposed therein/thereon. However, at smaller technology nodes, where chip space is at a premium, the presence of any void space on the chip that serves no useful purposes is undesirable.

In another well-known aspect of semiconductor fabrication, due to the large number of processing steps and wide range of processing variables encountered during the fabrication of a conventional device, it has become a practical necessity to incorporate a variety of electronic test structures ("e-test") on the wafer, to facilitate both the monitoring of the process and the testing of completed wafers. In one conventional configuration, the e-test structures are formed in what are termed "knockout areas," i.e., areas which would otherwise be devices. In another conventional configuration, the e-test structures are formed in active areas of the chip. As device structures become more complicated, it becomes necessary to incorporate a greater number of test structures, either in the knockout area or in the chip active area. However, as the number of test structures is increased, the constraint imposed by the area of the knockout, or the reduction in available active area, becomes a significant limitation.

Accordingly, it is desirable to provide improved semiconductor chip design. Particularly, it is desirable to provide semiconductor chip designs that reduce the use of void areas, such as those in the seal ring chamfer triangular areas at the chip corners. Still further, it would be desirable to reduce the need for including e-test structures in either the wafer knockout areas or in the chip active areas. Furthermore, other desirable features and characteristics of the present disclosure will become apparent from the subsequent detailed description and the appended claims, taken in conjunction with the accompanying drawings and the foregoing technical field and background.

BRIEF SUMMARY

Semiconductor wafers and chips, and methods of fabricating the same, which include seal rings and electronic test structures in chamfered areas outside of the seal rings, are generally disclosed. In one exemplary embodiment, disclosed is a semiconductor chip that includes an active area including a plurality of integrated circuit structures, a seal ring enclosing the active area, a corner area of the semiconductor chip that is outside of the seal ring in relation to the active area, and a fabricated structure, such as an electronic test structure, disposed within the corner area.

In another exemplary embodiment, disclosed is a semiconductor wafer that includes a plurality of semiconductor chips, wherein each semiconductor chip is separated from another semiconductor chip by a plurality of scribe lines configured to allow for singulation of the semiconductor wafer, wherein each semiconductor chip includes an active area including a plurality of integrated circuit structures, a seal ring enclosing the active area, a corner area of the semiconductor chip that is outside of the seal ring in relation to the active area, and a fabricated structure, such as an electronic test structure, disposed within the corner area.

In yet another exemplary embodiment, disclosed is a method for fabricating a plurality of individual semiconductor chips from a semiconductor wafer, wherein the method includes providing a semiconductor wafer, forming, on the semiconductor wafer, a plurality of semiconductor chips separated from one another by a plurality of scribe lines, wherein each chip of the plurality of semiconductor chips includes an active area including a plurality of integrated circuit structures, a seal ring enclosing the active area, a corner area of the semiconductor chip that is outside of the seal ring in relation to the active area, and a fabricated structure, such as an electronic test structure, disposed within the corner area. The method further includes singulating the semiconductor wafer along the scribe lines to form the plurality of individual semiconductor chips.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The present disclosure will hereinafter be described in conjunction with the following drawing figures, wherein like numerals denote like elements, and wherein.

DETAILED DESCRIPTION

Figure 1:
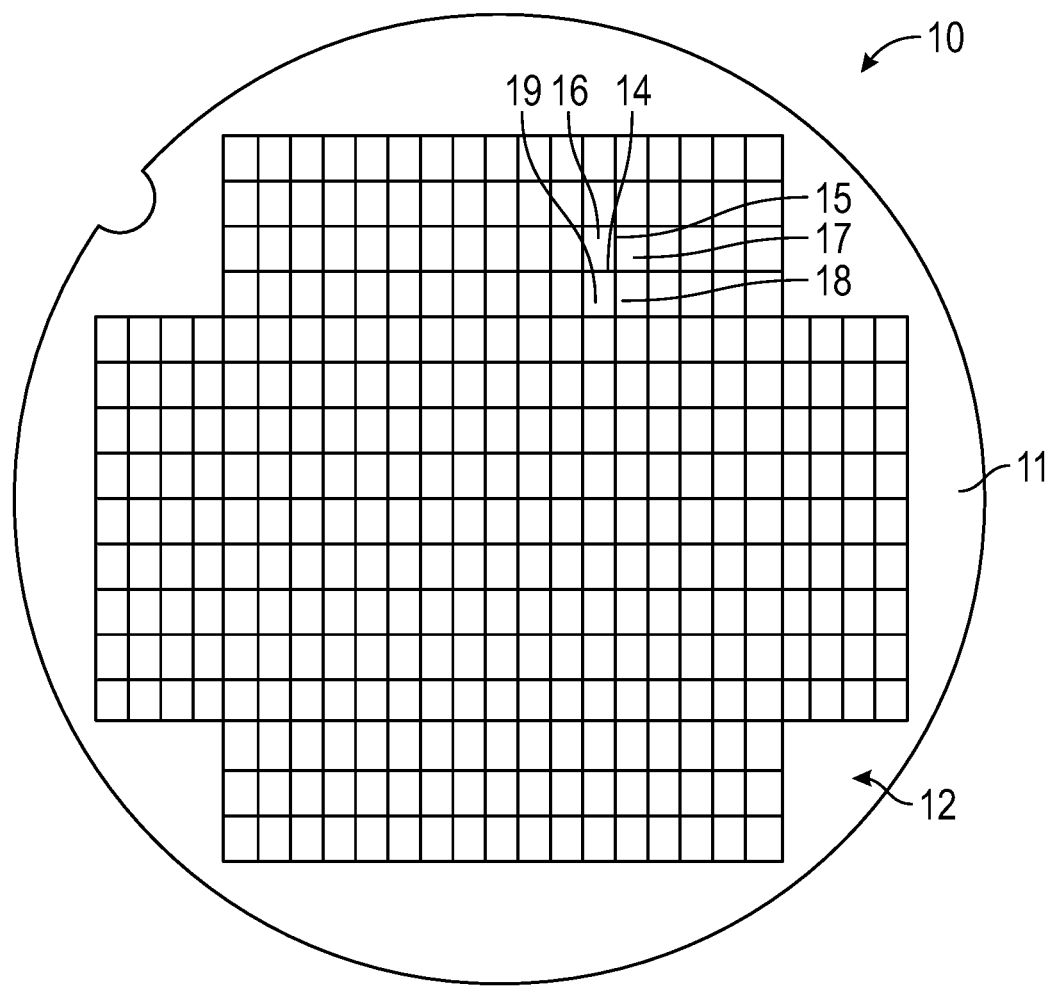
FIG. 1 is a plan (top) view of a semiconductor wafer illustrating dice and scribe lines.

The following detailed description is merely illustrative in nature and is not intended to limit the embodiments of the disclosed semiconductor wafers or the application and uses of such embodiments. Furthermore, there is no intention to be bound by any expressed or implied theory presented in the preceding technical field, background, brief summary or the following detailed description.

Embodiments of the present disclosure are generally directed to seal rings for semiconductor chips having e-test structures formed therein. For the sake of brevity, conventional techniques related to semiconductor wafer processing and fabrication may not be described in detail herein. Moreover, the various tasks and process steps described herein may be incorporated into a more comprehensive procedure or process having additional steps or functionality not described in detail herein. In particular, various steps in the manufacture of semiconductor wafers are well-known and so, in the interest of brevity, many conventional steps will only be mentioned briefly herein or will be omitted entirely without providing the well-known process details.

Furthermore, the drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Figure 2:
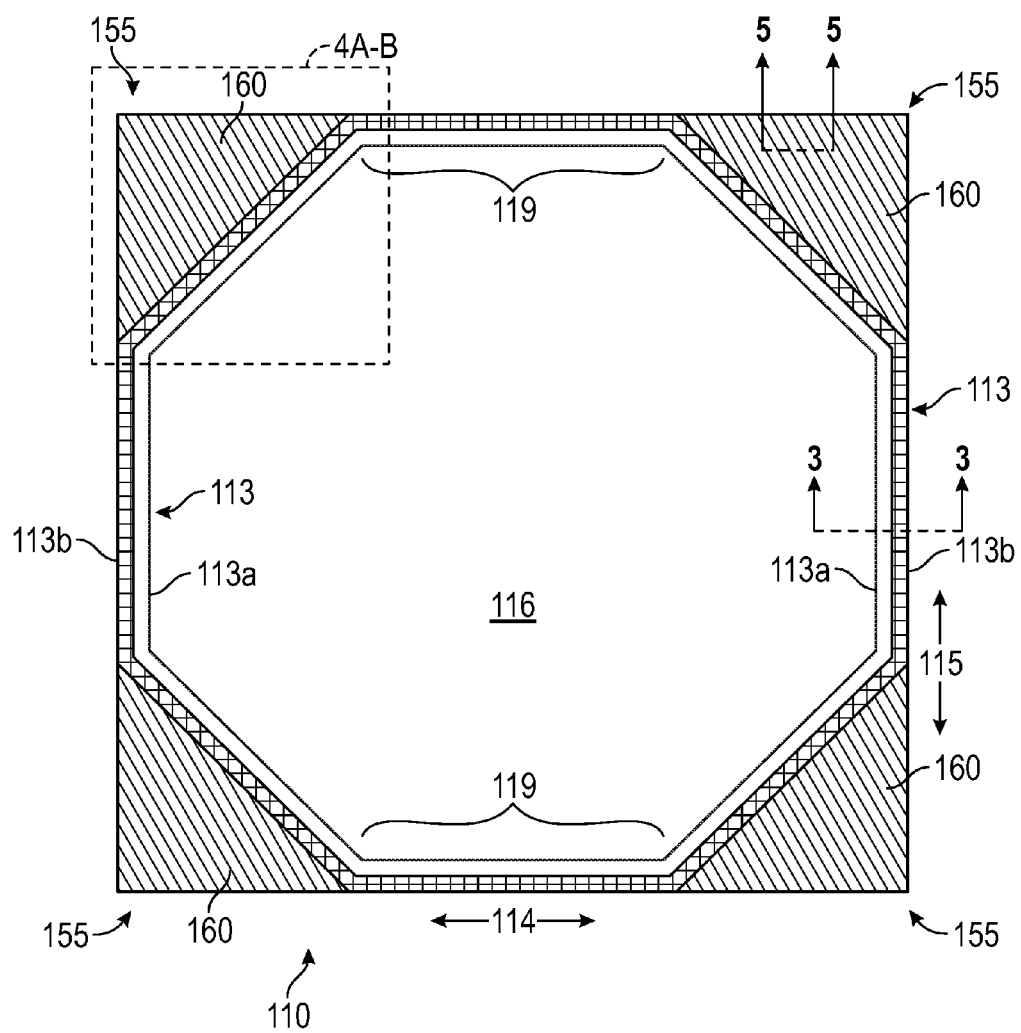
FIG. 2 is an expanded view of an exemplary die as may be present in the wafer of FIG. 1, the die having a seal ring and chamfered corners.

Disclosed herein is a generally rectangular semiconductor chip or die 110 that includes a seal ring configured with chamfered corners such that triangular corner areas are outside of the seal ring, as shown in FIG. 2. The seal ring may include multiple layers of metal interconnects and vias that enclose the active area of the chip, and provide protection to the integrated circuit structures in the active area from any damage that may be caused by the wafer dicing process. Beneficially, and in contrast to the prior art, space may be saved on the chip by including electronic test (e-test) structures in the triangular corner areas. The e-test structures may be provided in the form of magnetic tunnel junctions formed between various metallization layers and connected with one another by vias, which provides data storage ability for the e-test structures. Other suitable structures are also applicable. Accordingly, the presently described embodiments provide for a more compact wafer layout design that utilizes otherwise void corner space for operable testing structures. E-test structures are suitably included in the corner areas as they contain otherwise unused semiconductor substrates, which is a product of the geometry employed in fabricating the corner areas.

Figure 3:
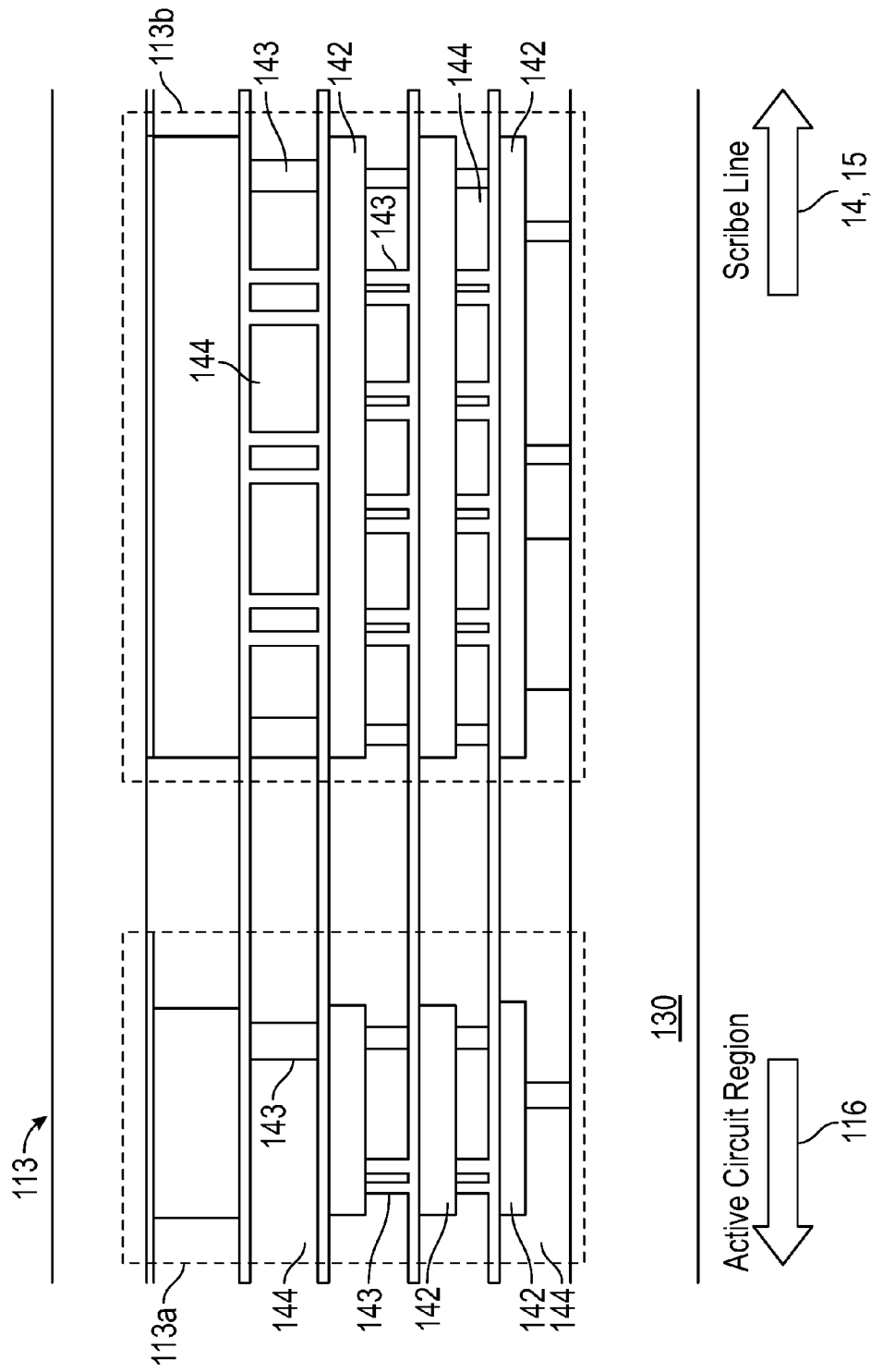
FIG. 3 is a cross-sectional view of a portion of the seal ring shown in FIG. 2.

Referring again to FIG. 2, integrated circuit chip or die 110 (expanded from an exemplary chip or die shown on the wafer of FIG. 1) includes an active area 116 surrounded and enclosed by a die seal ring 113. The chip or die 110 may be generally rectangular in shape, having length 115 and width 114, as illustrated. The seal ring 113 includes of a plurality of patterned metal layers, positioned on top of each other and mutually connected by via or contact plugs, as will be illustrated in greater detail in connection with FIG. 3 (FIG. 3 is a cross-sectional view of the seal ring taken along 3-3). The seal ring 113 is utilized to protect the active area 116 from being damaged by cracks originating from the wafer dicing process. The seal ring 113 may be a single seal barrier wall or may include dual-wall barriers formed in layers of similar or dissimilar dielectric materials. A dual-wall barrier configuration is provided by way of example in FIG. 2, having a relatively thinner inner wall 113a and a relatively thicker outer wall 113b (thickness and thinness being defined with respect to the area of the surface of the chip occupied by the width of a particular wall).

The seal ring 113 is manufactured step by step as sequential patterning and depositions of insulators and metals in conjunction with the fabrication of the integrated circuit elements. Typically, a heavily doped region (not shown) is diffused into the semiconductor material that forms chip 110 (such as any semiconductor material known in the art) in a process needed otherwise for fabricating strongly doped surface regions in some circuit elements. This heavily doped region serves as an anchor for the seal ring structure to be built, and permits the application of specific electrical potentials to the seal ring structure, such as ground potential or Vss. The overlying metals and insulators that form the seal ring may be built up, layer by layer, using patterning and deposition processes for insulating materials and metal wire lines that are well-known in the art.

The active area 116 may include components such as, for example, transistors, diffusions, memory arrays and interconnections. In embodiments, the chip or die 110 includes four triangular test circuit areas 160 at the four corners 155 thereof that are outside the die seal ring 113. The triangular areas 160 are formed by the pattern of the seal ring 113. That is, along each edge of the chip 110 (i.e., the edge that separates the chip from the scribe line), the seal ring 113 is only formed along such edge at a central area 119 thereof in relation to the length or width of the chip 110. At lateral ends of each edge, the seal ring 113 runs at an approximate 45 degree angle to reach a central area 119 of the adjacent edge, thereby forming triangular areas 160 at each corner 155 of the chip 110. In this manner, the seal ring may be in the form of a regular or irregular polygon with eight sides, such as, for example, a substantially regular octagon as illustrated. As such, the corners 155 of the chip 110 may be referred to herein as "chamfered," the term "chamfered" as used herein referring to a transitional edge between two faces (sides) of an object (seal ring 113), the transitional edge being approximately 45 degrees (although greater or lesser angles may be used in some alternative embodiments).

Turning now to FIG. 3, which provides a cross-sectional view of the seal ring 113 structure through 3-3 as shown in FIG. 2, seal ring thin inner and thick outer walls 113a, 113b are illustrated disposed over a base substrate 130. In one embodiment, seal ring walls 113a, 113b are concentric to each other and may be formed simultaneously or alternately. Each of the seal ring walls 113a, 113b may include various stacked conductive layers 142 and via layers 143 disposed through dielectric layers 144. The stacked conductive layers 142 may include any conductive material such as aluminum or copper, and may be formed in the conventional manner using damascene process for copper and subtractive process for aluminum, for example. The via layers 143 may include any conductive material such as copper or tungsten, and may be formed in the conventional manner using via etching/deposition processes, for example. Further, the dielectric layers 144 may include any insulating material such as oxides or nitrides of silicon, and may be formed using any conventional deposition processes, for example. It's also well known that via trench or via bar design is sometime used to increase the mechanical strength of the seal ring, instead of conventional circular via.

Figure 4A:
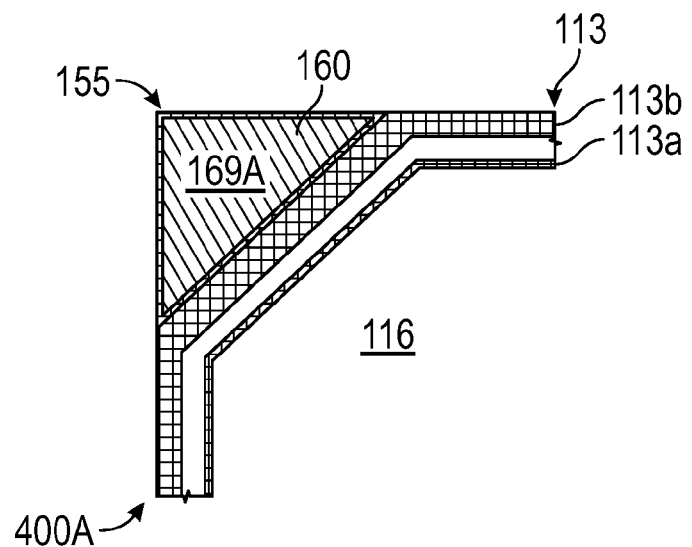
FIGS. 4A and 4B are expanded views of the chamfered corners shown in FIG. 2, illustrating alternative embodiments of e-test structures being provided in the chamfered corners.
Figure 4B:
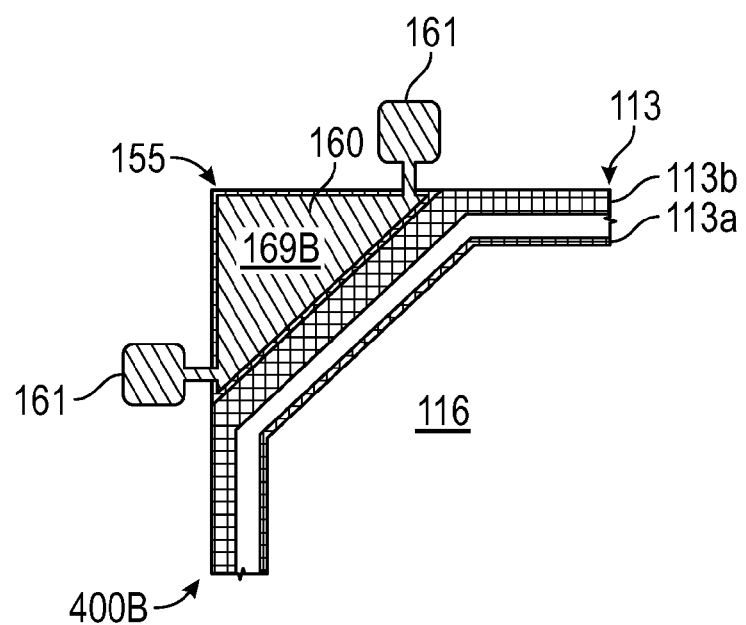
Figure 5:
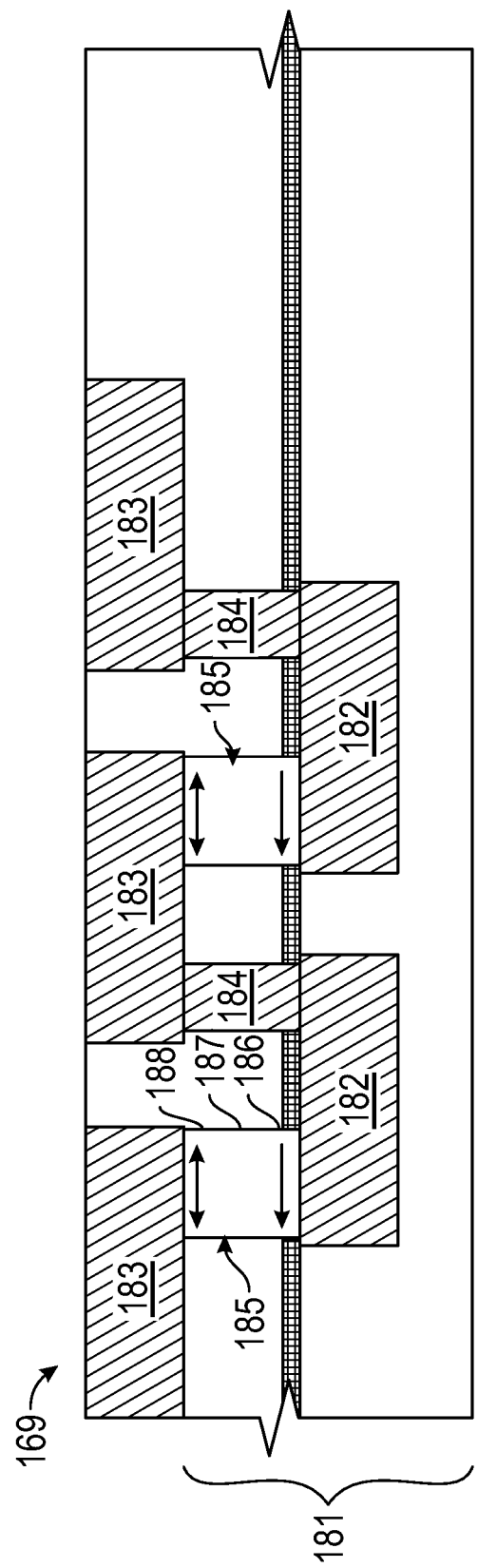
FIG. 5 is a cross-sectional view of a portion of the chamfered corners shown in FIG. 2, with an active ET structure placed.

Turning now to FIGS. 4A an 4B, which are alternate embodiments 400A, 400B of the area 4A-B shown in FIG. 2 (i.e., an expanded view of the chamfered corner areas 160), various electronic test (e-test) structures are illustrated. FIG. 4A illustrates embodiment 400A, which includes a "contactless" e-test structure 169A in the triangular corner area 160, outside of the seal ring 113, but inside of the scribe lines 14, 15. As used herein, the term "contactless" means that the measurement and operation of the e-test structure 169A is able to be performed without physical contact being made to any portion of the triangular corner area 160. An exemplary e-test structure is shown in FIG. 5, according to 5-5 of FIG. 2. In an alternative embodiment, FIG. 4B illustrates an e-test structure 169B, which includes contact pads 161, which are used to make physical contact with the e-test structure 169B by a measurement or testing device. As shown, contact pads 161 may be formed outside of the corner area 160 (i.e., in the scribe line 14, 15) to avoid the need for physical contact inside the seal ring triangular corner 160. In this sense, the contact pads 161 may be considered "sacrificial" in the sense that they will be destroyed by subsequent wafer dicing.

Turning now to FIG. 5, which illustrates a cross-sectional view of 5-5 as shown in FIG. 2, a portion of the chamfered corner area 160 is provided including various e-test structures 169. In some embodiments, the e-test structures 169 may be provided as magnetic tunnel junctions (MTJs) 185 in between bottom and top electrode layers 182, 183, connected by vias 184, and disposed within an insulating dielectric layer 181. The bottom electrodes 182, top electrodes 183, and vias 184 may be formed of any conventional conductive material such as copper, aluminum, or tungsten, and may be formed by any conventional back-end-of-line (BEOL) wiring/interconnect technique. MTJs 185 store data as an electric charge using magnetoresistive elements. Generally, the magnetoresistive elements are made from two magnetic layers, each of which holds a magnetization. The magnetization of one layer (the "pinned layer" 186) is fixed in its magnetic orientation, and the magnetization of the other layer (the "free layer" 188) can be changed by an external magnetic field generated by a programming current. The pinned and free layers 186, 188 are separated by a barrier layer 187. The magnetic field of a programming current can cause the magnetic orientations of the two magnetic layers 186, 188 to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations that allow for the functionality of the e-test structures 169 provided in triangular corner area 160. E-test structures may be used as a proxy to determine a variety of IC device characteristics, as is known in the art. Thus, the e-test structures may be used to monitor the quality of the fabrication process. The magnetic properties can be contactlessly measured by VSM, vibrating sample magnetometer. Other contactless structures can be also used.

Accordingly, referring back to FIG. 2 and FIGS. 3-5 in reference to FIG. 2, disclosed herein is a generally rectangular semiconductor chip or die 110 that includes a seal ring 113, the seal ring 113 being configured with chamfered corners such that triangular corner areas 160 of chip 110 are outside of the seal ring 113, and thus not included in the active area 116. As shown best in FIG. 3, the seal ring may be multiple layers of metal interconnects and vias that enclose the active area 116, and provide protection to the integrated circuit structures in the active area from any damage that may be caused by the wafer dicing process. As shown best in FIGS. 4A-B, space may be saved on the chip 110 by including necessary electronic test structures 169 in the triangular corner areas 160. The e-test structures may be provided in a contactless configuration 169A, or in a configuration 169B that utilizes contact pads 161 that extend outside of the corner area into the scribe line 14, 15. As best shown in FIG. 5, the e-test structures 169 may be provided in the form of magnetic tunnel junctions formed between various metallization layers and connected with one another by vias, the MTJs providing the necessary data storage ability for the e-test structures. Accordingly, the presently described embodiments provide for a more compact wafer layout design that utilizes otherwise void corner space for operable testing structures.

Moreover, a method for fabricating a plurality of individual semiconductor chips 110 from a semiconductor wafer 10 may be readily envisaged based on FIG. 2 and FIGS. 3-5 in reference to FIG. 2. The method includes providing a semiconductor wafer 10, forming, on the semiconductor wafer 10, a plurality of semiconductor chips 110 separated from one another by a plurality of scribe lines 14, 15, wherein each chip of the plurality of semiconductor chips 110 includes an active area 116 including a plurality of integrated circuit structures, a seal ring 113 enclosing the active area 116, a corner area 160 of the semiconductor chip 110 that is outside of the seal ring 113, and an electronic test structure 169 disposed within the corner area 160. The method further includes singulating (i.e., dicing) the semiconductor wafer 10 along the scribe lines 14, 15 to form the plurality of individual semiconductor chips 110.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor chip comprising:
    an active area including a plurality of integrated circuit structures;
    a seal ring enclosing the active area;
    a corner area of the semiconductor chip that is outside of the seal ring; and
    an electronic test structure disposed within the corner area, wherein the electronic test structure comprises a magnetic tunnel junction (MTJ) in between bottom and top electrode layers connected by vias, and disposed within an insulating dielectric layer.

2. The semiconductor chip of claim 1, wherein the active area comprises a semiconductor material, and wherein the plurality of integrated circuit structures are selected from the group consisting of: transistors, diffusions, memory arrays and interconnections.

3. The semiconductor chip of claim 1, wherein the seal ring comprises a single-walled structure.

4. The semiconductor chip of claim 1, wherein the seal ring comprises a dual-walled structure, wherein a concentric inner wall of the seal ring has a thickness that is less than a thickness of a concentric outer wall of the seal ring.

5. The semiconductor chip of claim 1, wherein the seal ring comprises stacked conductive layers and via layers disposed through dielectric layers.

6. The semiconductor chip of claim 1, wherein the semiconductor chip is configured in a substantial rectangular form, and wherein the seal ring is provided in a substantially octagonal form, thereby forming four corner areas of the semiconductor chip outside of the seal ring, each of the four corner areas comprising an electronic test structure.

7. The semiconductor chip of claim 1, wherein the electronic test structure is provided in a contactless configuration that excludes contact pads.

8. The semiconductor chip of claim 1, wherein the electronic test structure comprises a contact pad connected thereto, the contact pad being formed outside of the corner area and outside of the active area.

9. A semiconductor wafer comprising a plurality of semiconductor chips, wherein each semiconductor chip is separated from another semiconductor chip by a plurality of scribe lines configured to allow for singulation of the semiconductor wafer, wherein each semiconductor chip comprises:
    an active area including a plurality of integrated circuit structures;
    a seal ring enclosing the active area;
    a corner area of the semiconductor chip that is outside of the seal ring; and
    an electronic test structure disposed within the corner area, wherein the electronic test structure comprises a magnetic tunnel junction (MTJ) in between bottom and top electrode layers connected by vias, and disposed within an insulating dielectric layer.

10. The semiconductor wafer of claim 9, wherein the active area comprises a semiconductor material, and wherein the plurality of integrated circuit structures are selected from the group consisting of: transistors, diffusions, memory arrays and interconnections.

11. The semiconductor wafer of claim 9, wherein the seal ring comprises a single-walled structure.

12. The semiconductor wafer of claim 9, wherein the seal ring comprises a dual-walled structure, wherein a concentric inner wall of the seal ring has a thickness that is less than a thickness of a concentric outer wall of the seal ring.

13. The semiconductor wafer of claim 9, wherein the seal ring comprises stacked conductive layers and via layers disposed through dielectric layers.

14. The semiconductor wafer of claim 9, wherein the semiconductor chip is configured in a substantial rectangular form, and wherein the seal ring is provided in a substantially octagonal form, thereby forming four corner areas of the semiconductor chip outside of the seal ring, each of the four corner areas comprising an electronic test structure.

15. The semiconductor wafer of claim 9, wherein the electronic test structure is provided in a contactless configuration that excludes contact pads.

16. The semiconductor wafer of claim 9, wherein the electronic test structure comprises a contact pad connected thereto, the contact pad being formed outside of the corner area and outside of the active area.

* * * * *